(12) United States Patent
Choi et al.

(10) Patent No.: US 6,778,590 B1
(45) Date of Patent: Aug. 17, 2004

(54) CARRIER CHANGER AND CHANGING METHOD

(75) Inventors: In Sung Choi, Seoul (KR); Duk Ju Lee, Seoul (KR); Jong Ok Kim, Seoul (KR); Tae Hyung Lee, Seoul (KR)

(73) Assignee: SK Telecom Co., Ltd., Seoul (KR)

( * ) Notice: Subject to any disclaimer, the term of this patent is extended or adjusted under 35 U.S.C. 154(b) by 686 days.

(21) Appl. No.: 09/606,416

(22) Filed: Jun. 28, 2000

(30) Foreign Application Priority Data

Jun. 29, 1999 (KR) .......................................... 99-25098

(51) Int. Cl.[7] .................................................. H04B 3/00
(52) U.S. Cl. .................................... 375/145; 375/149
(58) Field of Search ................................ 375/135, 145, 375/149, 295, 259, 260, 297; 370/335, 342; 455/91, 103

(56) References Cited

U.S. PATENT DOCUMENTS

| | | | | |
|---|---|---|---|---|
| 5,623,487 A | * | 4/1997 | Natali | 370/342 |
| 5,729,570 A | * | 3/1998 | Magill | 375/206 |
| 6,031,862 A | * | 2/2000 | Fullerton et al. | 375/200 |
| 6,215,810 B1 | * | 4/2001 | Park | 375/131 |

\* cited by examiner

*Primary Examiner*—Emmanuel Bayard
*Assistant Examiner*—Dung X. Nguyen
(74) *Attorney, Agent, or Firm*—Dorsey & Whitney LLP

(57) ABSTRACT

A carrier changer and changing method capable of generating a plurality of pseudo carriers by one pseudo carrier generator is provided. In the carrier changer, a pseudo carrier generator selectively generates one of a plurality of forward pseudo carrier signals based on a forward signal by a time division. A forward signal processor receives the forward signal and generates a pseudo carrier generating signal based on the forward signal, and outputs the forward signal and the pseudo carrier signals generated by the pseudo carrier generator. A power amplifier amplifies powers of the forward signal and pseudo carrier signals from the forward signal processor. Since an output of a phase locked loop is generated according to a variable phase locked loop data, pseudo carrier signals having different frequencies can be obtained by one pseudo carrier generator. Since one power amplifier a plurality of pseudo carries signals, additional amplifiers need not being used. Since a plurality of pseudo carrier signals are generated by a time division, insertion loss due to usage of a divider and synthesizer is not generated.

7 Claims, 11 Drawing Sheets

ND CHANGING
CARRIER CHANGER AND CHANGING METHOD

BACKGROUND OF THE INVENTION

1. Field of the Invention

The present invention relates to a carrier changer, more particularly, to a carrier changer capable of generating a plurality of pseudo carriers by one pseudo carrier generator.

2. Prior Art

FIG. 1 is a block diagram for showing a configuration of a conventional carrier changer. The conventional carrier changer includes a traffic signal generator 102, a directional coupler 104, a divider 106, a plurality of carrier changing sections 108, a synthesizer 110, and a plurality of power amplifiers 112.

The traffic signal generator 102 generates a forward signal. A directional coupler 104 receives the forward signal from the traffic signal generator 102 and outputs it to a plurality of power amplifiers 112. The directional coupler 104 generates a pseudo carrier generating signal based on the traffic signal. The divider 106 divides the pseudo carrier generating signal into a plurality of signals. The plurality of carrier changing sections 108 generate a plurality of pseudo carrier signals F2, F3, F4, . . . , Fn based on the plurality of pseudo carrier generating signals from the divider 106. The synthesizer 110 synthesizes the plurality of pseudo carrier signals F2, F3, F4, . . . , Fn generated by the plurality of carrier changing sections 108. The plurality of power amplifiers 112 amplifies powers of the forward signal and the plurality of pseudo carrier signals F2, F3, F4, , . . . , Fn from the directional coupler 104.

According to the conventional carrier changer, since the number of carrier changing sections corresponding to the number of pseudo carriers to be generated, a divider, and a synthesizer are used, insertion loss is generated. In order to compensate for insertion loss, an additional power amplifier should be used.

U.S. Pat. No. 5,297,136 (issued to Claudio Soprano et al. on Mar. 22, 1994) discloses a multicarrier demodulator to demodulate simultaneously a great number of data channels having low and medium data rates, that is data rates lower than 4 Mbit/s.

SUMMARY OF THE INVENTION

Therefore, it is an object of the present invention, for the purpose of solving the above mentioned problems, to provide a carrier changer capable of generating a plurality of pseudo carriers by one pseudo carrier generator.

In order to attain the object, according to the present invention, there is provided a carrier changer comprising:

a pseudo carrier generator for selectively generating one of a plurality of forward pseudo carrier signals based on a forward signal by a time division;

a forward signal processor for receiving the forward signal and generating a pseudo carrier generating signal based on the forward signal, and outputting the forward signal and the pseudo carrier signals generated by the pseudo carrier generator; and Preferably, the pseudo carrier generator includes a first band pass filter for band pass filtering the pseudo carrier generating signal at a first predetermined bandwidth; a first amplifier for amplifying an output signal of the first band pass filter; an intermediate frequency generator for converting an output signal of the first amplifier into an intermediate frequency signal; an intermediate frequency amplifier for amplifying the intermediate frequency signal from the intermediate frequency generator according to a gain of the pseudo carrier generating signal; a frequency converter for generating one of the forward pseudo carrier signals based on an output signal of the intermediate frequency amplifier according to a variable phase locked loop frequency data; a second amplifier for amplifying the one of the forward pseudo carrier signal from the frequency converter; and a second band pass filter for band pass filtering an output signal of the second amplifier at a second predetermined bandwidth.

More preferably, the forward signal processor includes a first directional coupler for receiving and outputting the forward signal, and generating the pseudo carrier generating signal based on the forward signal by a loose coupling; a circulator for preventing the forward signal from the first directional coupler from outputting in a reverse direction; and a second directional coupler for outputting the forward pseudo carrier signal from the pseudo carrier generator and an output signal of the circulator by a loose coupling.

Also, there is provided a carrier changer comprising:

a pseudo carrier generator for selectively generating one of a plurality of pseudo carrier signals based on a one of a plurality of forward signals by a time division;

a plurality of forward signal processors each for receiving a forward signal, and outputting the forward signal and the pseudo carrier signal generated by the pseudo carrier generator;

a switch section for sequentially switching the forward signal and switching the pseudo carrier signal corresponding to the switched forward signal; and a plurality of power amplifiers each for amplifying powers of the forward signal and the pseudo carrier signals from one of the forward signal processors switched by the switch section.

Since an output of a phase locked loop is generated according to a variable phase locked loop data, pseudo carrier signals having different frequencies can be obtained by one pseudo carrier generator. Since one power amplifier a plurality of pseudo carries signals, additional amplifiers need not being used. Since a plurality of pseudo carrier signals are generated by a time division, insertion loss due to usage of a divider and synthesizer is not generated.

BRIEF DESCRIPTION OF THE DRAWINGS

Other features and advantages of the present invention will become more apparent from the following description taken in connection with the accompanying drawings, wherein.

DETAILED DESCRIPTION OF THE PREFERRED EMBODIMENT

The preferred embodiment of the present invention will hereinafter be described in detail with reference to the accompanying drawings.

Figure 1:
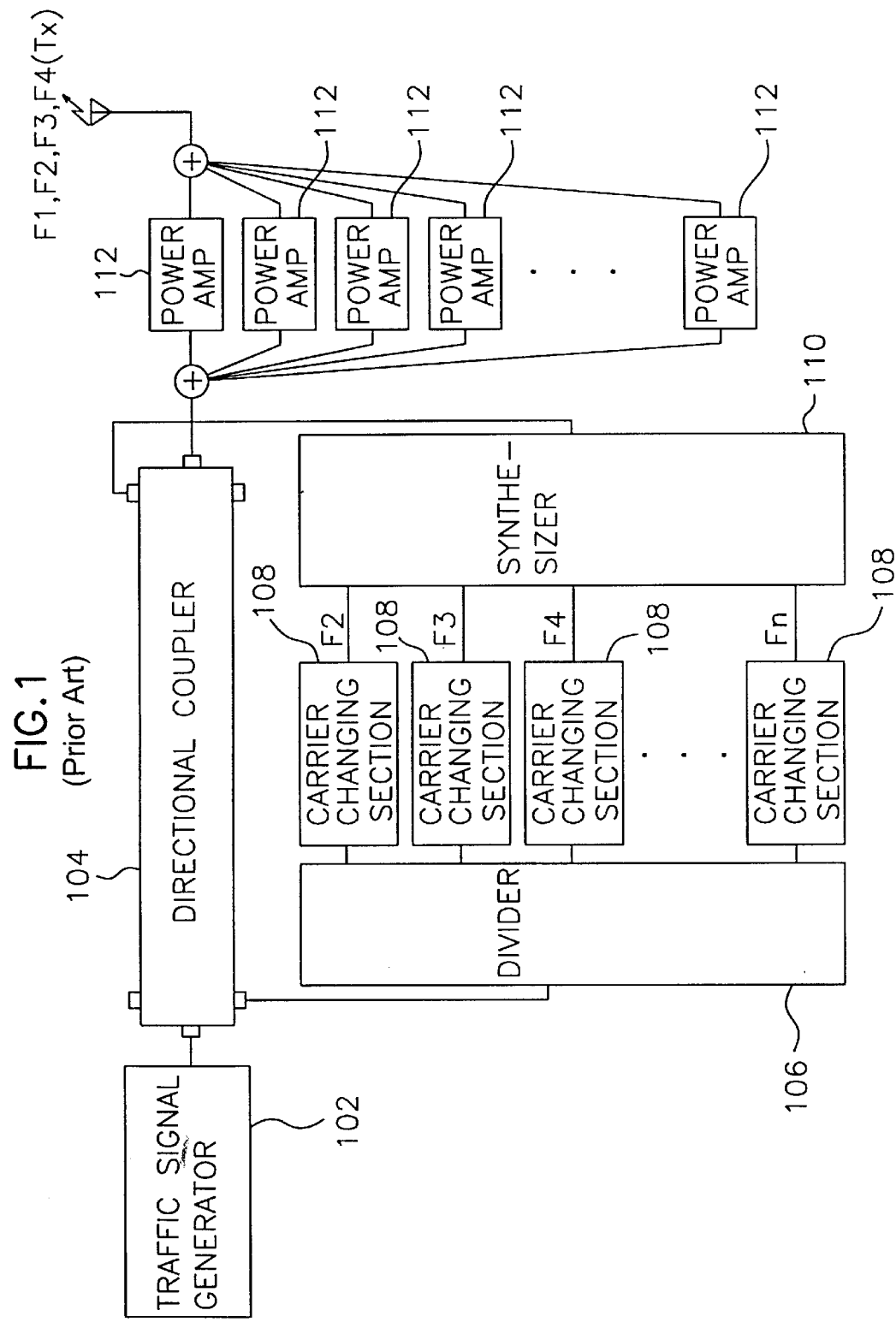
FIG. 1 is a block diagram for showing a configuration of a conventional carrier changer.
Figure 2:
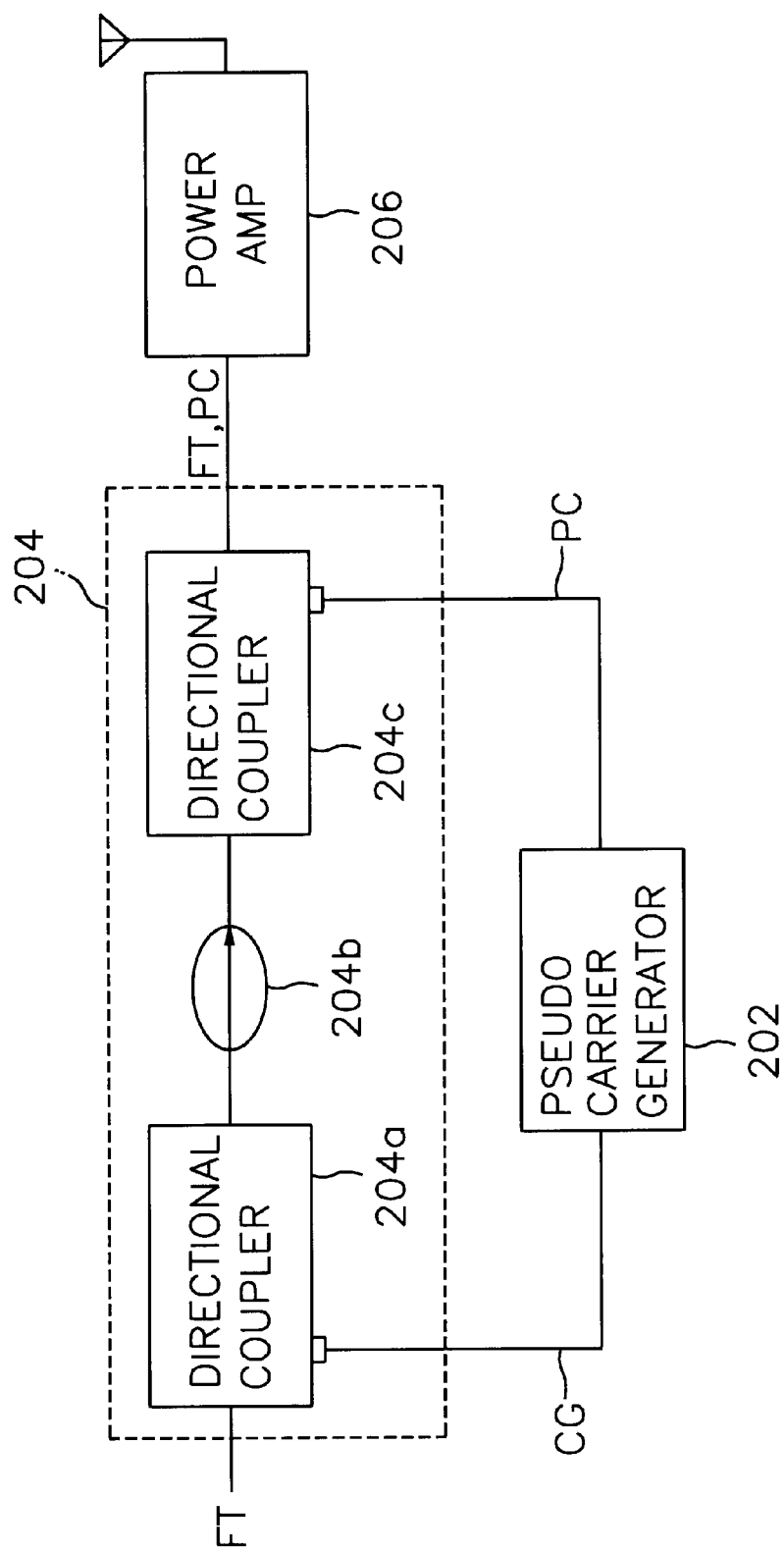
FIG. 2 is a block diagram for showing a configuration of a carrier changer according to a first embodiment of the present invention.

FIG. 2 shows a configuration of a carrier changer according to a first embodiment of the present invention. The carrier changer includes a pseudo carrier generator 202, a forward signal processor 204, and a power amplifier 206.

The pseudo carrier generator 202 selectively generates one of a plurality of forward pseudo carrier signals PC based on a forward signal FT by a time division. One of the plurality of forward pseudo carrier signals PC from the pseudo carrier generator 202 is outputted to the forward signal processor 204.

Figure 3:
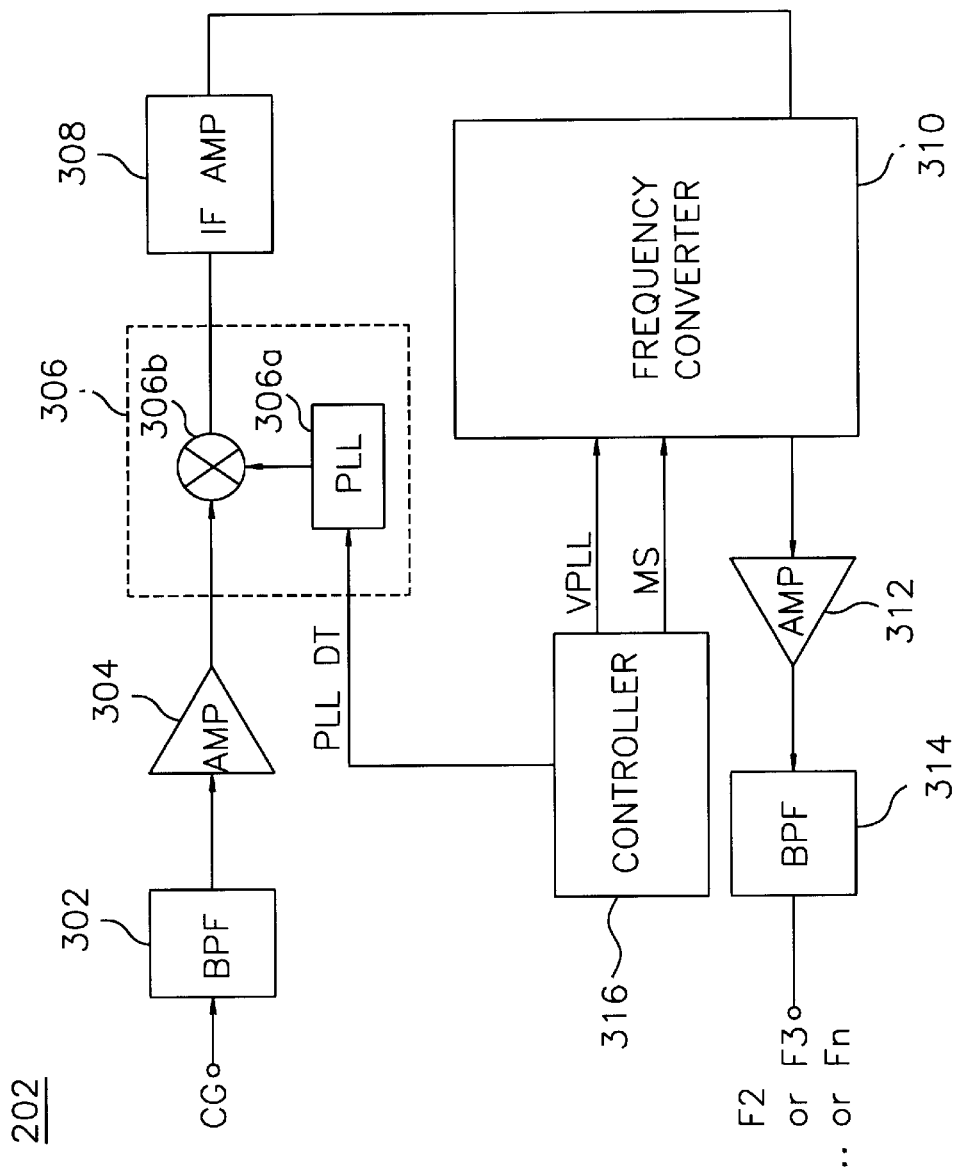
FIG. 3 is a detailed diagram for showing an example of the pseudo carrier generator.

FIG. 3 is a detailed diagram for showing an example of the pseudo carrier generator 202. The pseudo carrier generator 202 includes a first band pass filter 302, a first amplifier 304, an intermediate frequency generator 306, an intermediate frequency amplifier 308, a frequency converter 310, a second amplifier 312, a second band pass filter 314, and a control section 316.

The first band pass filter 302 band pass filters a pseudo carrier generating signal CG from the forward signal processor 204 at a first predetermined bandwidth. An output signal of the first band pass filter 302 is outputted to the first amplifier 304.

The first amplifier 304 amplifies an output signal of the first band pass filter 302. An output signal of the first amplifier 304 is outputted to the intermediate frequency generator 306.

The intermediate frequency generator 306 converts an output signal of the first amplifier 304 into an intermediate frequency signal. The intermediate frequency generator 306 includes a phase locked loop 306a and a mixer 306b. The phase locked loop 306a receives a phase locked loop frequency data PLL DT and generates a phase locked loop output signal based on the phase locked loop frequency data PLL DT in response to a system clock. The mixer 306b mixes an output signal of the first amplifier and the phase locked loop output signal from the phase locked loop 306a. The intermediate frequency signal from the intermediate frequency generator 306 is outputted to the intermediate frequency amplifier 308.

The intermediate frequency amplifier 308 amplifies the intermediate frequency signal from the intermediate frequency generator 306 according to a gain of the a pseudo carrier generating signal CG. An output signal of the intermediate frequency amplifier 308 is outputted to the frequency converter 310.

The frequency converter 310 generates one of the pseudo carrier signals PC based on an output signal of the intermediate frequency amplifier 308 according to a variable phase locked loop frequency data VPLL. One of the pseudo carrier signals PC from the frequency converter 310 is outputted to the second amplifier 312.

Figure 4:
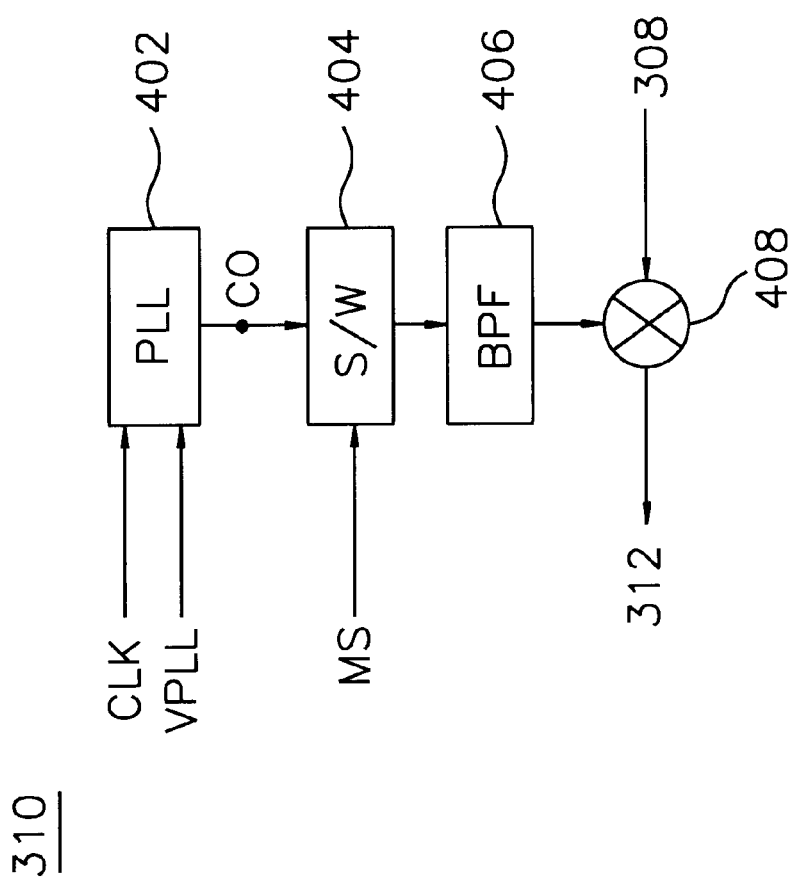
FIG. 4 is a detailed diagram for showing a first example of the frequency converter.

FIG. 4 is a detailed diagram for showing a first example of the frequency converter 310. The frequency converter 310 includes a first phase locked loop 402, a first frequency stabilizing selector 404, a third band pass filter 406, and a first mixer 408.

The first phase locked loop 402 receives the variable phase locked loop frequency data VPLL and generates a first pseudo carrier generating output signal based on the variable phase locked loop frequency data VPLL in response to a system clock CLK. The first frequency stabilizing selector 404 removes a transition part included in the first pseudo carrier generating output signal from the first phase locked loop 402 by a time switching. The third band pass filter 406 band pass filters an output signal of the frequency stabilizing selector 404 at a third predetermined bandwidth.

A first mixer 408 mixes the output signal of the intermediate frequency amplifier 308 and an output signal of the third band pass filter 406 in order to generate a pseudo frequency signal. The frequency converter 310 further includes a control section 316 for generating the variable phase locked loop frequency data VPLL and a masking signal MS for removing the transition part included in the first pseudo carrier generating out signal from the first phase locked loop 402.

Figure 5:
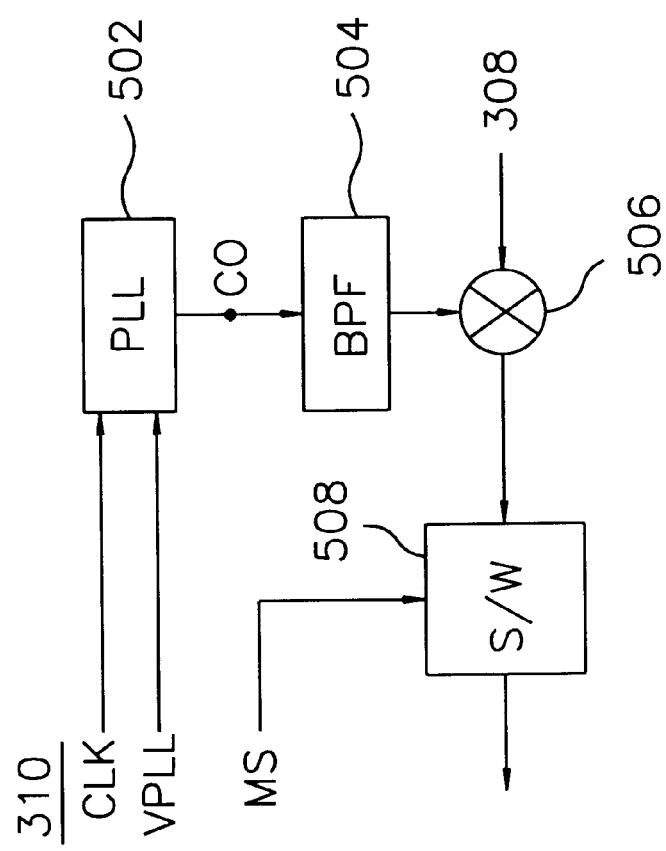
FIG. 5 is a detailed diagram for showing a second example of the frequency converter.

FIG. 5 is a detailed diagram for showing a second example of the frequency converter 310. The frequency converter 310 includes a second phase locked loop 502, a fourth band pass filter 504, a second mixer 506, and a second frequency stabilizing selector 508.

The second phase locked loop 502 receives the variable phase locked loop frequency data VPLL and generates a second pseudo carrier generating output signal based on the variable phase locked loop frequency data VPLL in response to a system clock CLK. The fourth band pass filter 504 band pass filters the second pseudo carrier generating output signal from the second phase locked loop 502 at a fourth predetermined bandwidth.

The second mixer 506 mixes the output signal of the intermediate frequency amplifier 308 and an output signal of the fourth band pass filter 504 The second frequency stabilizing selector 508 removes a transition part included in the pseudo frequency signal from the second mixer 506 by a time switching.

Figure 6:
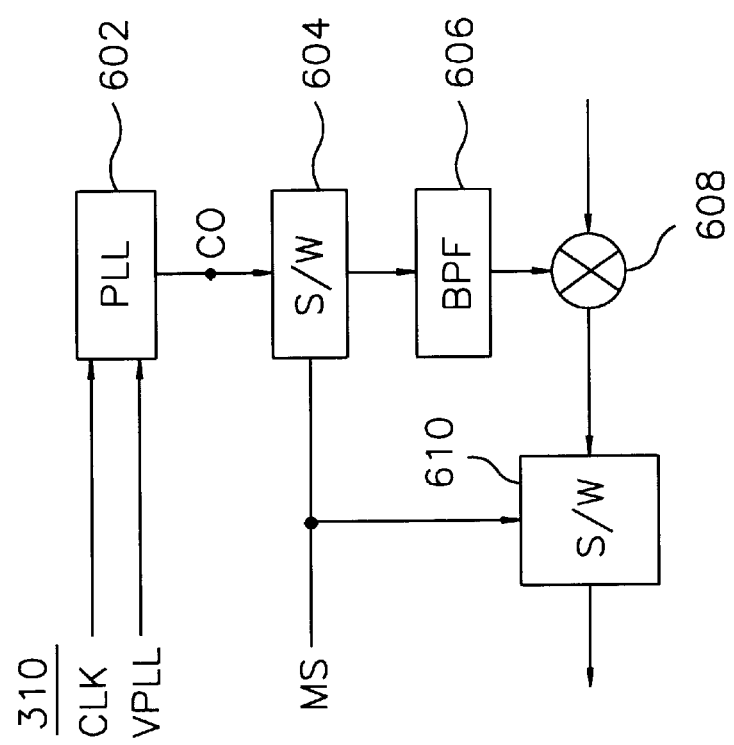
FIG. 6 is a detailed diagram for showing a third example of the frequency converter.

FIG. 6 is a detailed diagram for showing a third example of the frequency converter 310. The frequency converter 310 includes a third phase locked loop 602, a second frequency stabilizing selector 604, a fifth band pass filter 606, a third mixer 608, and a third frequency stabilizing selector 610.

The third phase locked loop 602 receives the variable phase locked loop frequency data and generates a pseudo carrier generating output signal CO based on the variable phase locked loop frequency data VPLL in response to a system clock CLK. The second frequency stabilizing selector 604 removes a transition part included in the pseudo carrier generating output signal from the third phase locked loop 602 by a time switching. The fifth band pass filter 606 band pass filters an output signal of the second frequency stabilizing selector 604 at a fifth predetermined bandwidth.

The third mixer 608 mixes the output signal of the intermediate frequency amplifier 308 and an output signal of the fifth band pass filter 606. The third frequency stabilizing selector 610 removes spurious included in the pseudo frequency signal from the third mixer 608 by a time switching.

The second amplifier 312 amplifies the one of the pseudo carrier signals from the frequency converter 310. An output signal of the second amplifier 312 is outputted to the second band pass filter 314.

The second band pass filter 314 band pass filters an output signal of the second amplifier 312 at a second predetermined bandwidth. The forward signal processor 204 receives the forward signal FT and generates a pseudo carrier generating signal CG based on the forward signal FT. The forward signal processor 204 mixes each of the pseudo carrier signals PC from the pseudo carrier generator 202 and the forward signal FT. The forward signal processor 204 includes a first directional coupler 204a, a circulator 204b, and a second directional coupler 204c.

The first directional coupler 204a receives and outputs the forward signal FT. The first directional coupler 204a generates a pseudo carrier generating signal based on the forward signal FT by a loose coupling. The circulator 204b prevents the forward signal from the first directional coupler 204a from outputting in a reverse direction. The second directional coupler 204c mixes the forward pseudo carrier signal from the pseudo carrier generator 202 and an output signal of the circulator 204b by a loose coupling.

The power amplifier 206 amplifies powers of the forward signal FT and each of the pseudo carrier signals PC from the forward signal processor 204.

Figure 7:
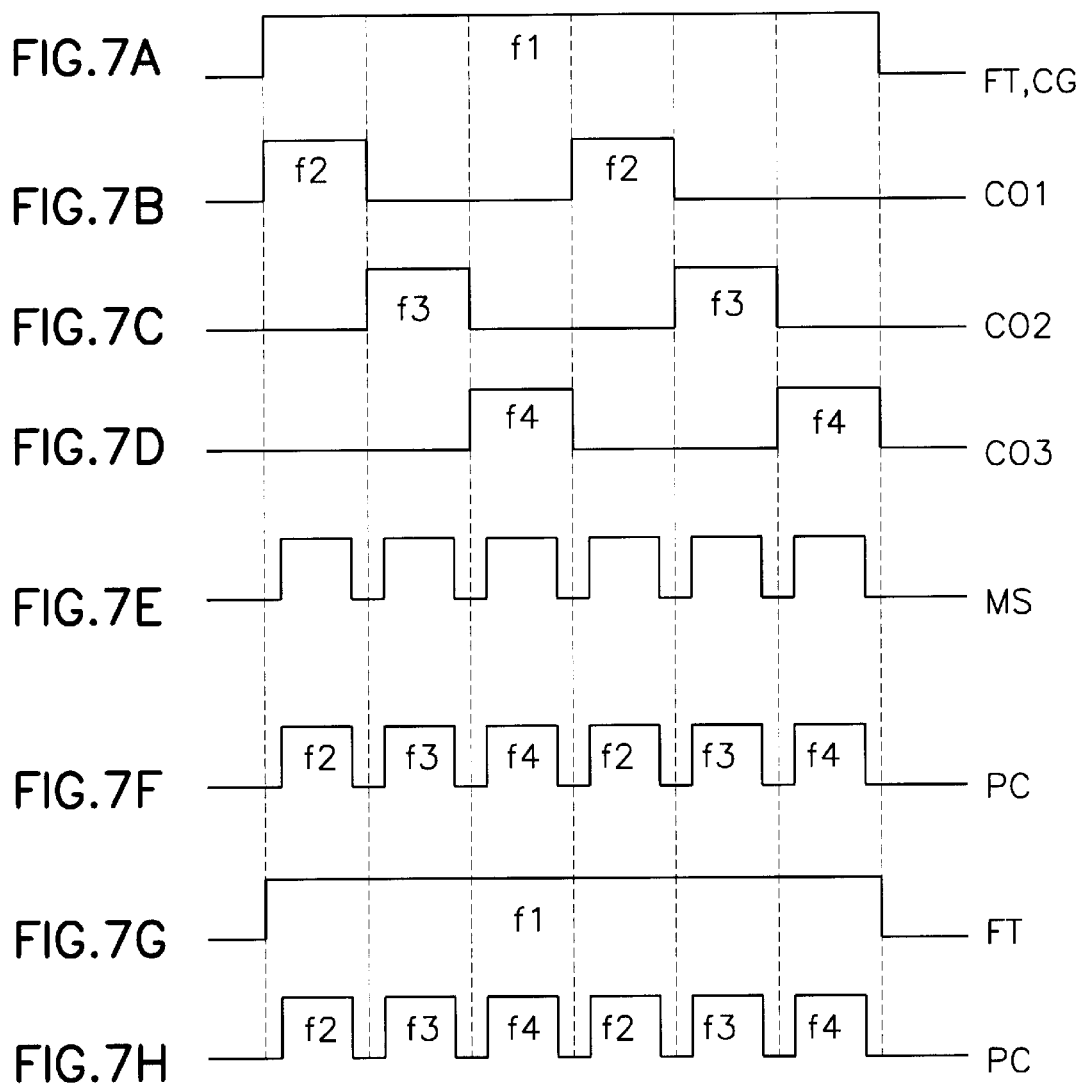
FIGS. 7A through 7H are timing diagrams for illustrating operations of the pseudo carrier generator and frequency converter.

FIG. 7A shows the forward signal FT received by the forward signal processor 202 or a pseudo carrier generating signal CS generated by the forward signal processor 202. FIGS. 7B through 7D show first pseudo carrier generating output signals CO1, CO2, and CO3 generated by the first phase locked loop 402. FIG. 7E shows a masking signal MS outputted by a control section 316. The masking signal MS is applied to the first frequency stabilizing selector 404 and serves to remove a transition part included in the first pseudo carrier generating output signal from the first phase locked loop 402 by a time switching.

FIG. 7F shows a plurality of forward pseudo carrier signals PC generated by a pseudo carrier generator 204. FIG. 7G shows the forward signal FT outputted by forward signal processor 204. FIG. 7H shows a plurality of pseudo carrier signals PC outputted by the forward signal processor 204.

Hereinafter, a carrier changing method according to a first embodiment of the present invention referring to FIG. 8.

Figure 8:
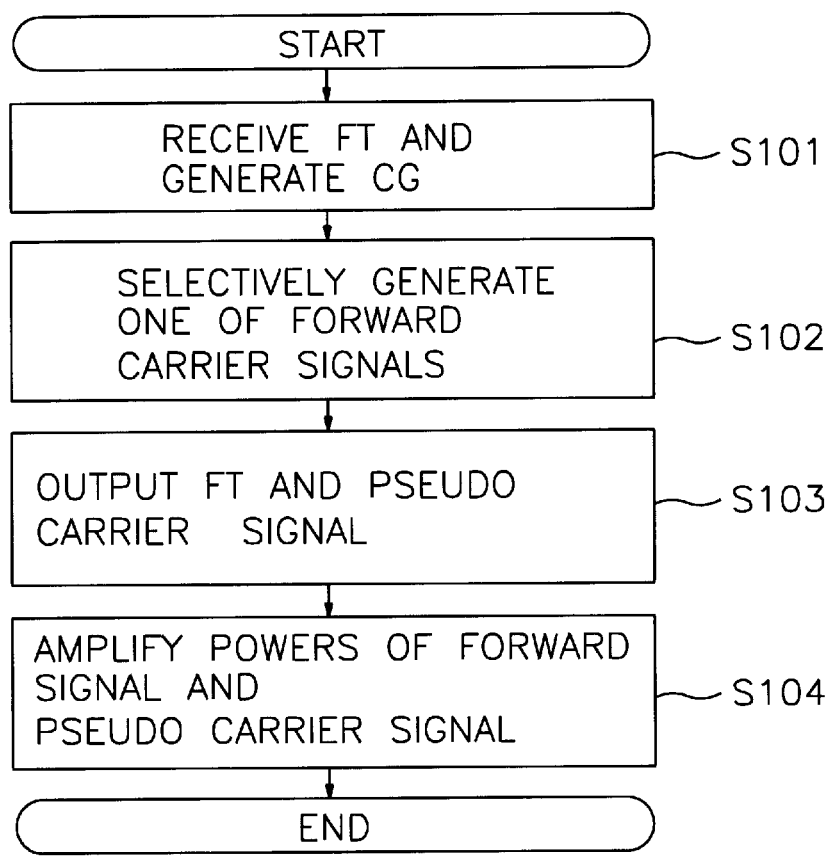
FIG. 8 is a flow chart for illustrating a carrier changing method according to a first embodiment of the present invention.

FIG. 8 is a flow chart for illustrating a carrier changing method according to a first embodiment of the present invention.

In step S101, the forward signal processor 204 receives a forward signal FT and generates a pseudo carrier generating signal CG based on the traffic signal FT, as shown in FIGS. 7A and 7B. The pseudo carrier generating signal CG from the forward signal processor is outputted to the pseudo carrier generator 202.

In step S102, the pseudo carrier generator 202 selectively generates one of a plurality of forward pseudo carrier signals based on the pseudo carrier generating signal CG from the forward signal processor 204 by a time division.

In step S103, the forward signal processor 202 outputs the forward signal FT and the pseudo carrier signal generated by the carrier generator 204. An output of the forward signal processor 202 is outputted to the power amplifier 206.

In step S104, the power amplifier amplifies powers of the forward signal and the pseudo carrier signals mixed by the forward signal processor 202.

Figure 9:
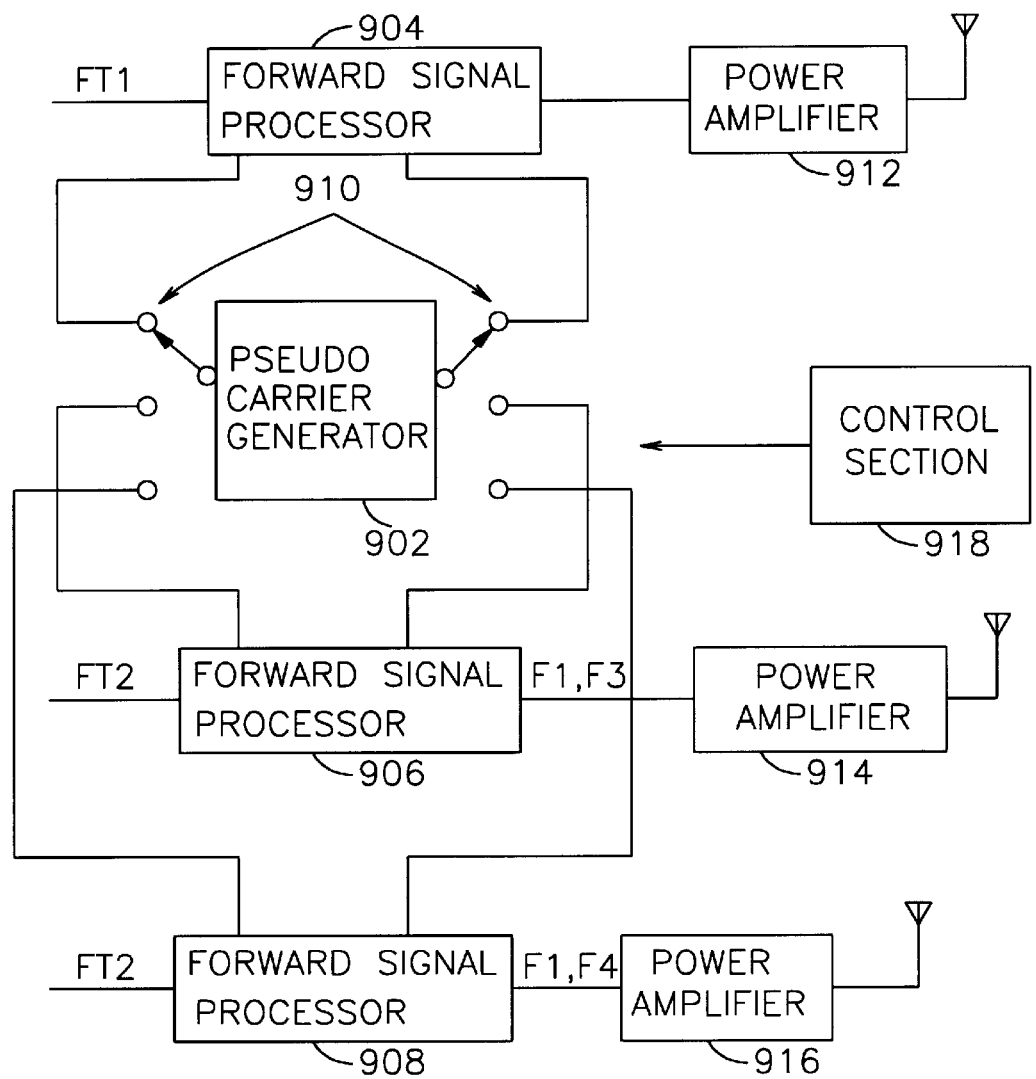
FIG. 9 is a block diagram for showing a configuration of a carrier changer according to a second embodiment of the present invention.

FIG. 9 is a block diagram for showing a configuration of a carrier changer according to a second embodiment of the present invention. The carrier changer includes a pseudo carrier generator 902, first, second, and third forward signal processors 904, 906, and 908, a switch section 910, and first, second, and third power amplifiers 912, 914, and 916.

The pseudo carrier generator 902 selectively generates one of first, second, and third pseudo carrier signals based on a one of first, second, and third forward signals FT1, FT2, and FT3 by a time division.

First, second, and third forward signal processors 904, 906, and 908 receive first, second, and third sector forward signal FT1, FT2, and FT3. First, second, and third forward signal processors 904, 906, and 908 output the first, second, and third pseudo carrier signals from the pseudo carrier generator 1002 and the first, second, and third sector forward signal, respectively.

The switch section 910 sequentially switches one of the first, second, and third sector forward signals FT1, FT2, and FT3 and switches one of the first, second, and third sector pseudo carrier signals corresponding to the switched forward signals.

First, second, and third power amplifiers 912, 914, and 916 each amplifies powers of the forward signal and the pseudo carrier signals from one of the forward signal processors switched by the switch section 910.

The control section 918 stores a current sector. The control section 918 judges whether a sector changes. The control section 1118 controls a sector switching operation according to the judgement result.

Figure 10A:
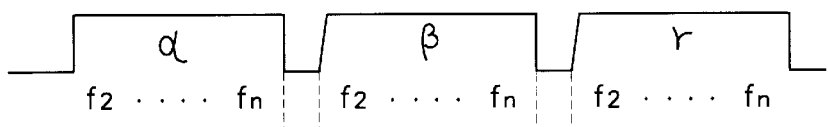
FIG. 10 is a timing diagram for illustrating an operation of the carrier changer shown in FIG. 9.
Figure 10B:
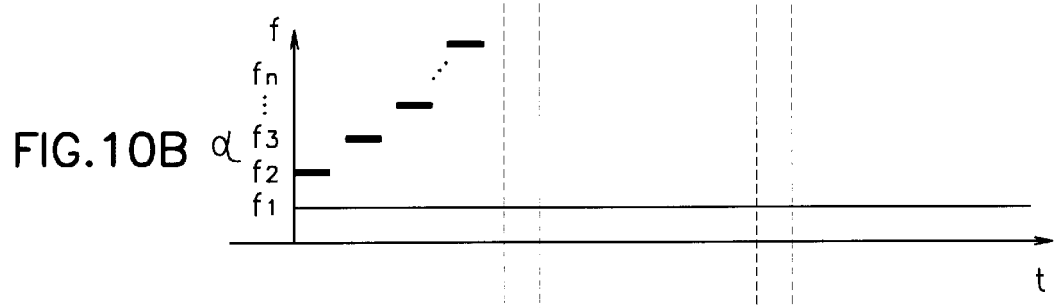
Figure 10C:
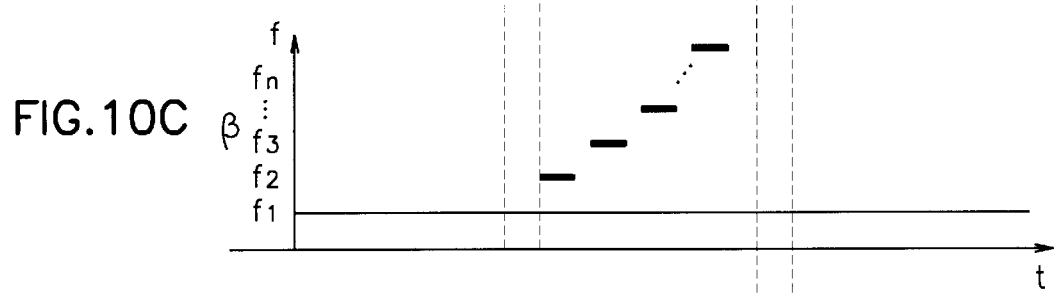
Figure 10D:
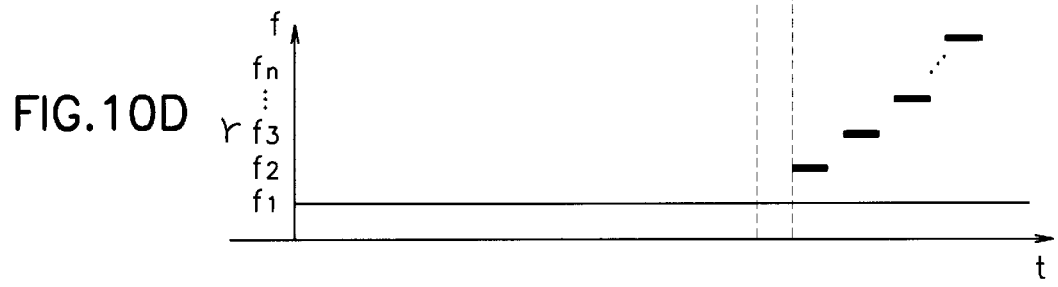

FIG. 10A shows a first pulse α, a second pulse β, and a third pulse γ for selecting first, second, and third sectors, respectively. FIG. 10B shows first, second, and third sector pseudo carrier signals outputted from the pseudo carrier generator 940a according to a time lapse when the first sector is selected. FIG. 10C shows first, second, and third pseudo carrier signals outputted from the pseudo carrier generator 940a according to a time lapse when the second sector is selected. FIG. 10D shows first, second, and third pseudo carrier signals outputted from the pseudo carrier generator 940a according to a time lapse when the third sector is selected.

Figure 11:
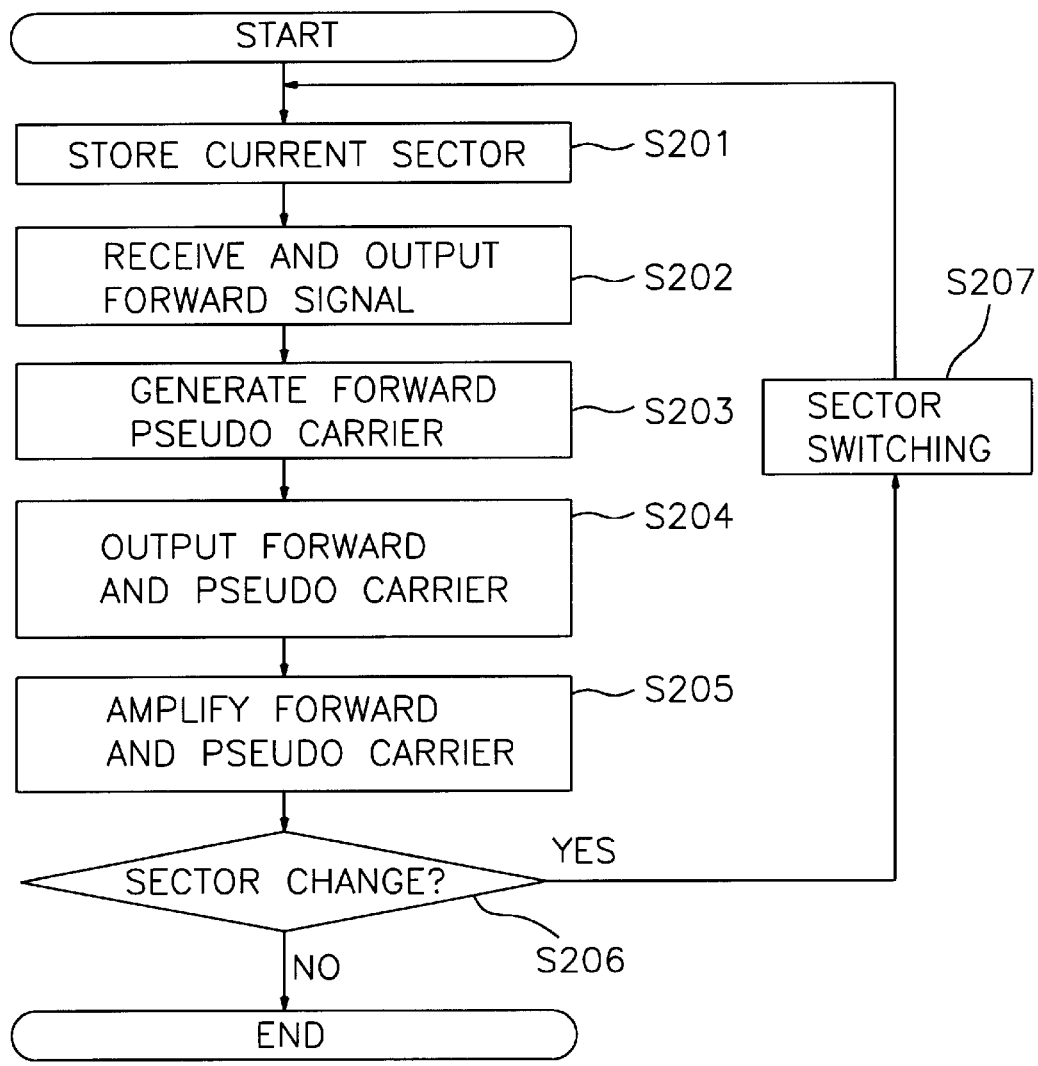
FIG. 11 is a flow chart for illustrating a carrier changing method according to a second embodiment of the present invention.

A carrier changing method according to a second embodiment of the present invention will be now described with reference to FIG. 11. FIG. 11 is a flow chart for illustrating a carrier changing method according to a second embodiment of the present invention.

In step S201, the control section 918 stores a current sector. In step S202, one of the first, second, and third forward signal processors 904, 906, and 908 receives and outputs a forward signal corresponding to the current sector stored in step S201. In step S203, the pseudo carrier generator 902 generates a forward pseudo carrier signal based on the forward signal outputted in step S202.

In step S204 mixes and outputs the forward signal outputted in step S202 and the forward pseudo carrier signal generated in step S203. In step S205, one of the first, second, and third amplifiers 912, 914, and 916 amplifies the forward signal and forward pseudo carrier signal outputted in step S204. In step S206, the control section 918 judges whether a sector changes. As a result of the judgement in step S206, when the sector changes, the control section 918 controls the switch section 910 to perform a sector switching operation (step S207) and the routine returns to step S201. When it judged that the sector does not change, the total operation finishes.

According to the present invention, since an output of a phase locked loop is generated according to a variable phase locked loop data, pseudo carrier signals having different frequencies can be obtained by one pseudo carrier generator. Since one power amplifier a plurality of pseudo carries signals, additional amplifiers need not being used. Since a plurality of pseudo carrier signals are generated by a time division, insertion loss due to usage of a divider and synthesizer is not generated.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A carrier changer comprising:
    a pseudo carrier generator for selectively generating one of a plurality of forward pseudo carrier signals based on a forward signal by a time division;
    a forward signal processor for receiving the forward signal and generating a pseudo carrier generating signal based on the forward signal, and outputting the forward signal and the plurality of forward pseudo carrier signals generated by the pseudo carrier generator; and
    a power amplifier for amplifying powers of the forward signal and pseudo carrier signals from the forward signal processor, wherein the pseudo carrier generator includes
    a first band pass filter for band pass filtering the pseudo carrier generating signal at a first predetermined bandwidth;
    a first amplifier for amplifying an output signal of the first band pass filter;
    an intermediate frequency generator for converting an output signal of the first amplifier into an intermediate frequency signal;
    an intermediate frequency amplifier for amplifying the intermediate frequency signal from the intermediate frequency generator according to a gain of the pseudo carrier generating signal;
    a frequency converter for generating one of the forward pseudo carrier signals based on an output signal of the intermediate frequency amplifier according to a variable phase locked loop frequency data;
    a second amplifier for amplifying the one of the forward pseudo carrier signal from the frequency converter; and
    a second band pass filter for band pass filtering an output signal of the second amplifier at a second predetermined bandwidth.

2. The carrier changer as defined in claim 1, wherein the intermediate frequency generator includes
    a phase locked loop for receiving a phase locked loop frequency data and generating a phase locked loop output signal based on the phase locked loop frequency data in response to a system clock; and
    a mixer for mixing an output signal of the first amplifier and the phase locked loop output signal from the phase locked loop.

3. The carrier changer as defined in claim 1, wherein the frequency converter includes
    a first phase locked loop for receiving the variable phase locked loop frequency data and generating a first pseudo carrier generating output signal based on the variable phase locked loop frequency data in response to a system clock;
    a first frequency stabilizing selector for removing a transition part included in the first pseudo carrier generating output signal from the first phase locked loop by a time switching;
    a third band pass filter for band pass filtering an output signal of the first frequency stabilizing selector at a third predetermined bandwidth; and
    a first mixer for mixing the output signal of the intermediate frequency amplifier and an output signal of the third band pass filter.

4. The carrier changer as defined in claim 3, the frequency converter further includes a control section for generating a masking signal for removing the transition part included in the first pseudo carrier generating out signal from the first phase locked loop.

5. The carrier changer as defined in claim 1, wherein the frequency converter includes
    a second phase locked loop for receiving the variable phase locked loop frequency data and generating a second pseudo carrier generating output signal based on the variable phase locked loop frequency data in response to a system clock;
    a fourth band pass filter for band pass filtering the second pseudo carrier generating output signal from the second phase locked loop at a fourth predetermined bandwidth;
    a second mixer for mixing the output signal of the intermediate frequency amplifier and an output signal of the fourth band pass filter; and
    a second frequency stabilizing selector for removing a transition part included in the pseudo frequency signal from the second mixer by a time switching.

6. The carrier changer as defined in claim 2, wherein the frequency converter includes
    a third phase locked loop for receiving the variable phase locked loop frequency data and generating a pseudo carrier generating output signal based on the variable phase locked loop frequency data in response to a system clock;
    a second frequency stabilizing selector for removing a transition part included in the pseudo carrier generating output signal from the third phase locked loop by a time switching;
    a fifth band pass filter for band pass filtering an output signal of the second frequency stabilizing selector at a fifth predetermined bandwidth; and
    a third mixer for mixing the output signal of the intermediate frequency amplifier and an output signal of the fifth band pass filter in order to generate a pseudo frequency signal; and
    a third frequency stabilizing selector for removing spurious included in the pseudo frequency signal from the third mixer by a time switching.

7. The frequency changer as defined in claim 1, wherein the forward signal processor includes a first directional coupler for receiving and outputting the forward signal, and generating the pseudo carrier generating signal based on the forward signal by a loose coupling;
    a circulator for preventing the forward signal from the first directional coupler from outputting in a reverse direction; and
    a second directional coupler for outputting the forward pseudo carrier signal from the pseudo carrier generator and an output signal of the circulator by a loose coupling.

* * * * *